US011239993B2

(12) United States Patent
Geng et al.

(10) Patent No.: US 11,239,993 B2
(45) Date of Patent: *Feb. 1, 2022

(54) CLOCK SYNTONIZATION USING NETWORK EFFECT AND/OR ADAPTIVE STOCHASTIC CONTROL

(71) Applicant: Clockwork Systems, Inc., Palo Alto, CA (US)

(72) Inventors: Yilong Geng, Menlo Park, CA (US);
Deepak Merugu, Sunnyvale, CA (US);
Balaji S. Prabhakar, Palo Alto, CA (US)

(73) Assignee: CLOCKWORK SYSTEMS, INC., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/142,824

(22) Filed: Jan. 6, 2021

(65) Prior Publication Data

US 2021/0160046 A1 May 27, 2021

Related U.S. Application Data

(63) Continuation of application No. 16/815,486, filed on Mar. 11, 2020, now Pat. No. 10,917,229, which is a continuation of application No. 16/443,791, filed on Jun. 17, 2019, now Pat. No. 10,623,173.

(51) Int. Cl.
*H04L 7/00* (2006.01)
*H04L 7/033* (2006.01)
*G06N 20/10* (2019.01)
*H03L 7/087* (2006.01)

(52) U.S. Cl.
CPC ............ *H04L 7/033* (2013.01); *G06N 20/10* (2019.01); *H03L 7/087* (2013.01)

(58) Field of Classification Search
CPC .......... H04L 7/033; H03L 7/087; G06N 20/10
USPC ........................................... 375/355
See application file for complete search history.

(56) References Cited

U.S. PATENT DOCUMENTS

| 10,623,173 | B1* | 4/2020 | Geng | ............ H04J 3/0676 |
|---|---|---|---|---|
| 10,917,229 | B2* | 2/2021 | Geng | ............ G06N 20/10 |
| 2011/0268097 | A1* | 11/2011 | Agrawala | ......... H04W 56/002 370/338 |
| 2018/0237039 | A1* | 8/2018 | Mong | ............ H04L 67/322 |
| 2018/0343183 | A1* | 11/2018 | Pope | ............ H04L 69/28 |
| 2019/0042525 | A1* | 2/2019 | McElrath | ......... G06F 9/4887 |
| 2019/0123843 | A1* | 4/2019 | Bush | ............ H04L 63/061 |

* cited by examiner

*Primary Examiner* — Don N Vo
(74) *Attorney, Agent, or Firm* — Fenwick & West LLP

(57) ABSTRACT

Systems and methods are disclosed herein for syntonizing machines in a network. A coordinator accesses probe records for probes transmitted at different times between pairs of machines in the mesh network. For different pairs of machines, the coordinator estimates the drift between the pair of machines based on the transit times of probes transmitted between the pair of machines as indicated by the probe records. For different loops of at least three machines in the mesh network, the coordinator calculates a loop drift error based on a sum of the estimated drifts between pairs of machines around the loop and adjusts the estimated absolute drifts of the machines based on the loop drift errors. Here, the absolute drift is defined relative to a drift of a reference machine.

20 Claims, 8 Drawing Sheets

400

| 410 Probe ID | 420 Transmitting Node | 430 Receiving Node | 440 Transmit Time | 450 Receive Time |
|---|---|---|---|---|
| 1 (Reject) | A | B | T1 | T1 + TT |
| 2 (Reject) | A | B | T1 + δ | T1 + δ + TT + D |
| 3 (Reject) | A | B | T2 | T2 + TT + D |
| 4 (Reject) | A | B | T2 + δ | T2 + δ + TT |
| 5 (Coded Probe) | A | B | T3 | T3 + TT |
| 6 (Coded Probe) | A | B | T3 + δ | T3 + δ + TT |

δ = transmission time spacing
TT = transit time for one probe
D = Delay

FIG. 4

CLOCK SYNTONIZATION USING NETWORK EFFECT AND/OR ADAPTIVE STOCHASTIC CONTROL

CROSS REFERENCE TO RELATED APPLICATIONS

This application is a continuation of U.S. application Ser. No. 16/815,486, filed Mar. 11, 2020 which is a continuation of co-pending U.S. application Ser. No. 16/443,791, filed Jun. 17, 2019, which is incorporated by reference in its entirety.

TECHNICAL FIELD

This disclosure relates generally to clock syntonization (i.e., correcting frequency drift) of a local clock of a machine relative to a reference clock, for example using network observations and/or adaptive stochastic control.

DESCRIPTION OF THE RELATED ART

Limits to clock synchronization accuracy between machines (e.g., in a data center) impose practical limitations in many applications. For example, in finance and e-commerce, clock synchronization is crucial for determining transaction order, in that a trading platform must match bids and offers in the order in which those bids and offers are placed. If clocks of machines used to submit or route the bids and offers are not synchronized, then bids and offers may be matched out of order, which results in a lack of fairness. Similar problems occur in other networked computer systems, such as distributed databases, distributed ledgers (e.g., blockchain), distributed transaction tracing systems, distributed snapshotting of computation or networks, 5G mobile network communications, and so on. In these systems, limits on clock synchronization result in jitter, which results in biased or non-optimal processing of communications.

Related art attempts to achieve accuracy in clock synchronization on the order of one hundred nanoseconds or better are generally expensive and impractical, as these attempts require specially designed hardware to be implemented throughout a network for combatting random network delays, component noise, and the like.

Within clock synchronization, clock syntonization (i.e., matching the frequency of different clocks) is an important subtask. Even if two clocks are perfectly synchronized at an instant in time, they will drift out of synchronization if their clock frequencies are not also matched (i.e., syntonized). Because clock frequencies can drift due to thermal and other environmental factors, clock syntonization is also generally expensive and impractical.

As a result, nanosecond-level clock synchronization is rarely used and, instead, algorithms that achieve millisecond-level accuracy without requiring specialized equipment throughout the network have become the norm (e.g., Network Time Protocol (NTP)). The world has simply come to accept and tolerate the lack of fairness inherent in the technical limitations of those millisecond-level synchronization solutions.

BRIEF DESCRIPTION OF THE DRAWINGS

FIG. 4 is a data structure diagram that illustrates probe records, and manners of identifying coded probes from the probe records, according to an embodiment of the disclosure.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

In order to ensure clocks are synchronized to a high degree of accuracy, at least two parameters are controlled on a continuous (e.g., periodic, but ongoing) basis. First, offset, which describes a difference by which two clocks differ in their estimation of time, is determined and adjusted for. For example, if clock A estimates that it is currently 4:05pm, and clock B estimates that it is currently 4:15pm, then an offset of 10 minutes exists between clock A and clock B. Second, frequency drift (also referred to as "drift"), which describes a difference in the frequency of two clocks, is determined and adjusted for. For example, inexpensive clocks have quartz components and quartz is sensitive to temperature and vibration. As temperature changes, or vibration occurs, the frequency of a clock using quartz will change over time, and this change is tracked as described herein.

The systems and methods disclosed herein may be used to improve accuracy of clock synchronization to a degree of nanoseconds due to finetuned systems and processes for estimating offset and drift of any given clock. Further, clocks are guaranteed to not deviate from a time indicated by a reference clock beyond an upper and lower bound, the upper and lower bound being within twenty-five standard deviations of synchronization error, which is on the order of one microsecond. Offset and drift estimations contain noise, which is introduced based on, e.g., queuing delays of packets used to estimate offset and drift, as well as the effect of network operation (e.g., latency introduced during transmission). The finetuned systems and processes of estimating offset and drift as described herein are resistant to noise from offset and drift estimates (e.g., using advanced filtering techniques), and thus enable highly precise clock synchronization. These systems and methods achieve such accuracy even when the response of each clock to control input may be different (e.g., responses differ between different clocks), unknown (e.g., a clock's response is not known a priori), and time-varying (e.g., a clock's response changes over time). This allows these systems and methods to be applied to commodity, off-the-shelf, and inexpensive clocks. Further, these systems and methods can be implemented without a requirement for implementing any extra hardware.

Figure 1:
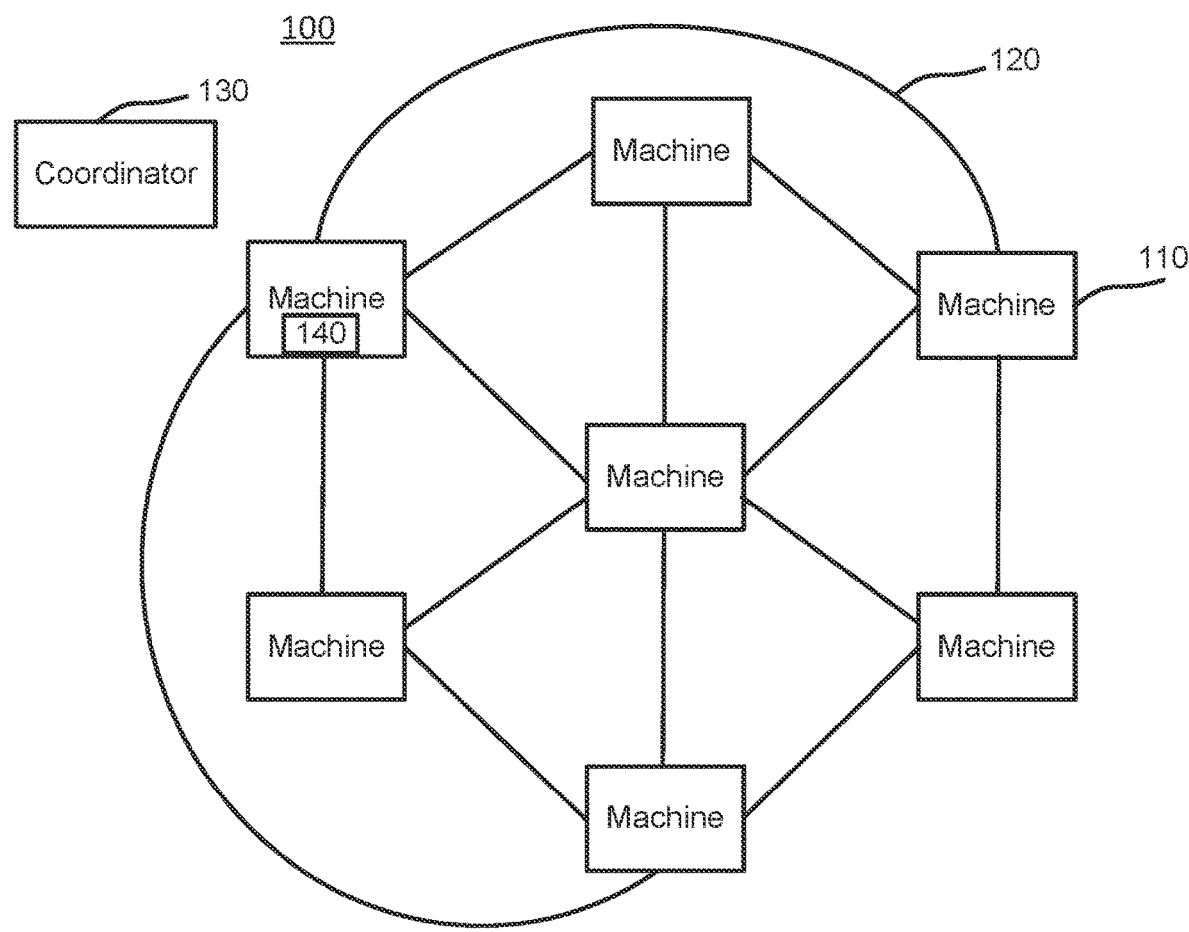
FIG. 1 is a graph of a network including a coordinator for executing an embodiment of the disclosure.

FIG. 1 is a graph of a network including a coordinator for executing an embodiment of the disclosure. Network 100 includes machines 110, which are the nodes of the graph. The term "machine" refers to any device that maintains a clock or produces timestamps, such as a physical or virtual machine, a server, a server blade, a virtual machine, and the like. Each of machines 110 includes a local clock (e.g., as implemented in a computer processing unit (CPU) of a machine, or as implemented in a device that is operably coupled to a machine, such as a network interface card (NIC) of a machine). As depicted, network 100 is a mesh network, where each machine 110 is linked to each other machine 110 by way of one or more links (some links omitted for clarity). However, network 100 may be any other type of network. For example, network 100 may be a network where machines are serially connected on a wire, or may be in any other configuration. The network may be a large network spanning multiple physical regions (e.g., New York to San Francisco), or a small network, such as a network within a single server blade. In an embodiment, network 100 may be a network of clocks on one or more printed circuit boards.

The communication links between any pair of machines are represented as an edge 120 between the nodes in the graph. Each edge 120 typically represents multiple paths between any two machines 110. For example, the network 110 may include many additional nodes other than the machines 110 that are shown, so that there may be multiple different paths through different nodes between any pair of machines 100.

Network 100 additionally includes coordinator 130 and reference clock 140. In this example, coordinator 130 commands machines 110 to obtain network observations by probing other machines 110, as will be described in greater detail below with respect to FIG. 3. Coordinator 130 may store, or cause to be stored, records of those network observations, as will be described in greater detail below with respect to FIG. 4. Coordinator 130 may additionally transmit control signals to machines 110. The term control signal, as used herein, may refer to a signal indicating that the frequency of a local clock of a machine is to be adjusted by a specified amount (thus correcting a drift of the local clock), and may also refer to a signal indicating that a time indicated by a local clock a machine is to be adjusted by a specified amount (thus correcting an offset of the local clock).

In an embodiment, coordinator 130 stores, either within a machine housing coordinator 130 or within one or more machines of network 100, a graph that maps the topology of network 100. The graph may include a data structure that maps connections between machines of network 100. For example, the graph may map both direct connections between machines (e.g., machines that are next hops from one another, either physically or logically), as well as indirect connections between machines (e.g., each multi-hop path that can be taken for a communication, such as a probe, to traverse from one machine to another). The graph may additionally include network observations corresponding to each edge in the graph (e.g., indicating probe transit times for probes that crossed the edge, and/or additional information, such as information depicted in FIG. 4).

One of the machines contains a reference clock 140. Reference clock 140 is a clock to which the clocks within the machines of network 100 are to be synchronized. In an embodiment, reference clock 140 is a highly calibrated clock that is not subject to drift, which is contained in a machine 110 that is different than the other machines to be synchronized. In another embodiment, reference clock 140 may be an off-the-shelf local clock already existing in a machine 110 that will act as a master reference for the other machines 110, irrespective of whether reference clock 140 is a highly tuned clock that is accurate to "absolute time" as may be determined by an atomic clock or some other highly precise source clock. In such scenarios, coordinator 130 may select which machine 110 will act as the master reference arbitrarily, or may assign the reference machine based on input from an administrator. The reference clock may be a time source, such as a global positioning system (GPS) clock, a precision time protocol (PTP) Grandmaster clock, an atomic clock, or the like, in embodiments where the reference clock 140 is accurate to "absolute time." As will be described in greater detail with respect to FIGS. 6-8, coordinator 130 may use reference clock 140 when calibrating a control signal. By signaling corrections to frequency and/or offset based on reference clock 140, coordinator 130 achieves high-precision synchronization of the local clocks of machines 110 to the reference clock 140.

While only one reference clock 140 is depicted in FIG. 1, in an embodiment, multiple reference clocks 140 may be present. For example, additional reference clocks may be used for redundancy in case of failures of the reference clocks or the machines housing them. As another example, machines 110 may be divided into multiple groups (e.g., based on settings applied by an administrator of network 100). For example, network 100 may be configured to divide machines 110 into groups that each have a predefined number, or percentage, of machines 100, which may improve performance or implementation. Within each group, one machine may be nominated to be a reference, and the clock of that machine will thus be used as the reference clock for the remaining machines. Further, the groups may nominate one group as a reference group, thus leading to the reference group's reference clock acting as a reference for all groups. The reference clock and group may be nominated automatically consistent with clock nomination described herein, or may be input by a network administrator. As an example, where a network includes five thousand machines, and an administrator programs the network to divide the machines into groups that each hold one hundred machines (e.g., based on specifying one hundred machines, or by specifying a percentage), there will be fifty groups of machines, each including one hundred machines. One of the one hundred machines will be a reference machine, and the other ninety-nine of the one hundred machines will be sync to the reference machine's clock. Moreover, of the fifty groups, one will be a reference group, and the other fourty-nine groups will sync to the reference group.

Coordinator 130 may be implemented in a stand-alone server, may be implemented within one or more of machines 110, or may have its functionality distributed across two or more machines 130 and/or a standalone server. Coordinator 130 may be accessible by way of a link 120 in network 100, or by way of a link to a machine or server housing coordinator 130 outside of network 100. Reference clock 140 may be implemented within coordinator 130, or may be implemented as a separate entity into any of machines 110, a standalone server within network 100, or a server or machine outside of network 100.

Figure 2:
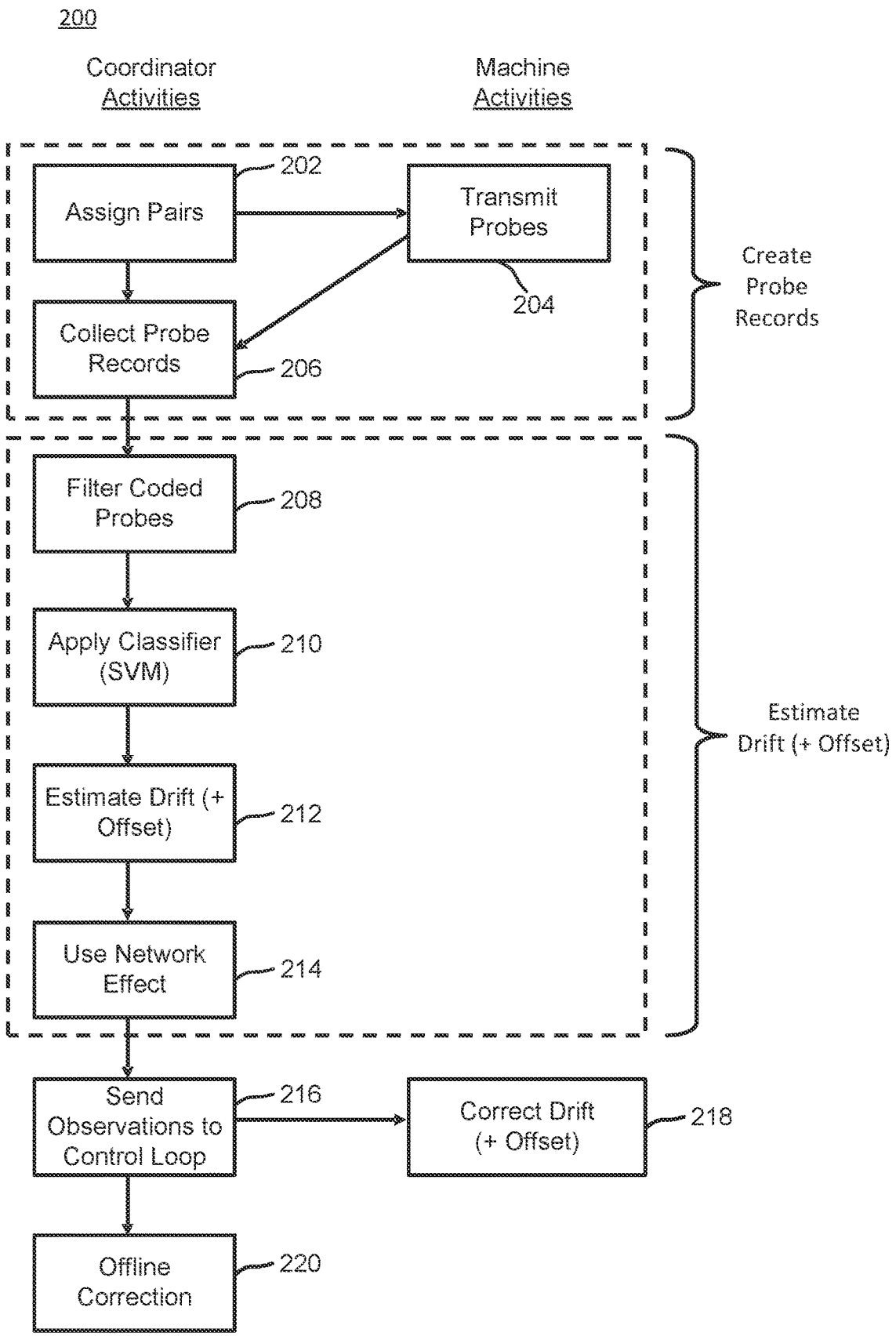
FIG. 2 is a data flow diagram for correcting clock frequency and/or offset, according to an embodiment of the disclosure.

FIG. 2 is a data flow diagram for correcting clock frequency and/or offset, according to an embodiment of the disclosure. The left column of FIG. 2 describes activities of a coordinator (e.g., coordinator 130) in achieving highly precise clock synchronization by correcting clock frequency (i.e., drift) and/or offset; the right column describes activities of machines (e.g., machines 110). FIG. 2 can be thought of as including three phases—a first phase where network observations are made by having machines probe other machines of a network (e.g., network 100), a second phase where the network observations are used to estimate offset and drift of the machines, and a third phase where frequency and/or offset is compensated/corrected in order to achieve highly precise clock synchronization between the machines.

As part of the first phase, data flow 200 begins with a coordinator (e.g., coordinator 130) assigning 202 machine pairs. The term pair, as used herein, refers to machines that send probes to one another for the purpose of collecting network observations. As used herein, the term network observations may refer to observable qualities of a network (e.g., effect of network operation, as defined below; queuing delays; observable drift; offset; etc.). The term probes, as used herein, refers to an electronic communication transmitted from one machine to another machine, where the electronic communication is timestamped at its time of transmission from a sending machine, and at its time of receipt at a receiving machine. The timestamps may be applied by any component of the machines that are configured to apply timestamps, such as respective CPUs of the sending and receiving machines and/or respective NICs that are a part of, or that are operably coupled to, the sending and receiving machines. As will be described in further detail with respect to FIG. 3, a single machine typically is paired with multiple other machines. When assigning machine pairs, the coordinator may assign a machine to pair with a number of machines, the number being less than all machines in the network. In an embodiment, the number and pairings of machines may be predefined or may dynamically change based on network conditions (e.g. congestion, latency, etc.). The machines may be selected at random, or through a deterministic algorithm.

Figure 3:
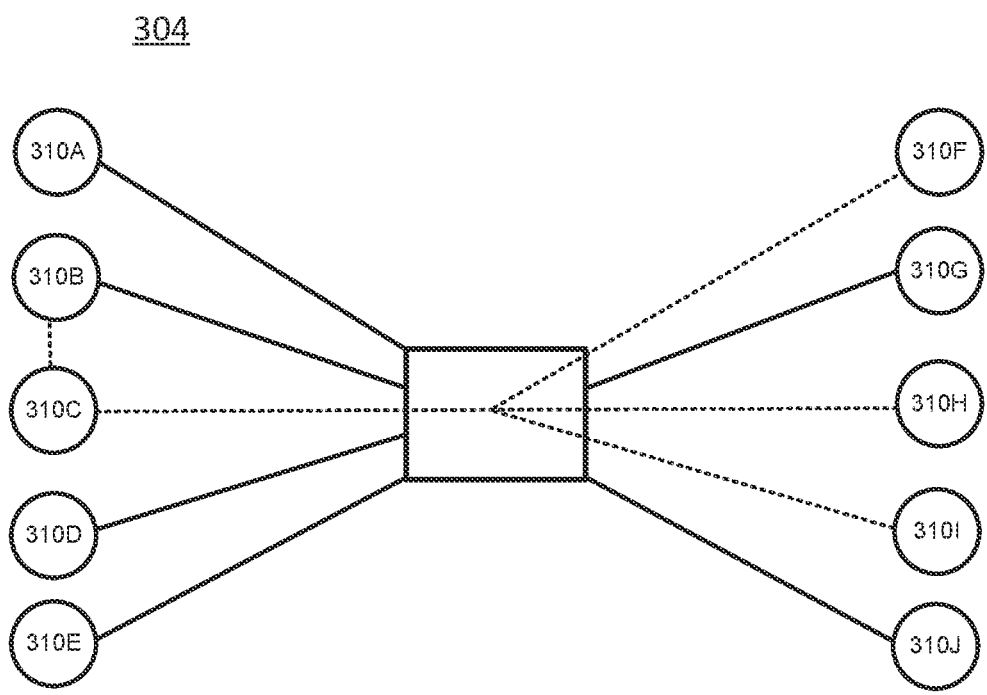
FIG. 3 is a block diagram of a system that illustrates probe transmission, according to an embodiment of the disclosure.

Data flow 200 progresses by coordinator 130 instructing the paired machines to transmit 204 probes to one another, which will also be described in further detail with respect to FIG. 3. The network observations collected from the probe transmissions are collected 206 into probe records. The term probe record, as used herein, may refer to a data structure including network observations obtained from the probe transmissions, such as the identity of a transmitting machine and a receiving machine, a transmit timestamp, a receive timestamp, etc. The transit time for a probe may be determined based on the transmit timestamp and the receive timestamp. Probe records are described in further detail below with respect to FIG. 4. While the embodiment described here and depicted in FIG. 3 indicates that the coordinator collects the probe records, in an embodiment, some or all of the machines may each collect probe records pertaining to probes transmitted to or from them, and may themselves perform processing on the probe records.

After the probe records are collected, the coordinator (e.g., coordinator 130) enters the second phase of using the collected probe records to estimate offset and/or drift for the machines (e.g., machines 110). In this example, to achieve accurate estimations, the coordinator first filters 208 the probe records to identify coded probes. The term coded probes, as used herein, refers to probes that correspond to probe records that are not affected by noise, such as delay caused from queuing the probes. One manner in which the coordinator identifies coded probes is described in further detail with respect to FIG. 4. The subset of probe records that correspond to coded probes may be referred to as coded probe records. In an embodiment where probe records are collected at a given machine, that given machine may perform the filtering 208 of the probe records collected by that given machine.

Data flow 200 continues by applying 210 a classifier to the coded probe records. The classifier may be a machine learning model trained through supervised learning. An example classifier is a support vector machine ("SVM"). The coordinator may input upper and lower bound points derived from coded probe data (i.e., samples of transit time) from two paired machines over a time period. The output of the classifier is a linear fit to the transit time data with a slope and intercept. Data flow 200 then continues with the coordinator estimating 212 the drift between pairs of machines. In an embodiment, the coordinator estimates drift to be equivalent to, or a function of, the slope of the linear fit (i.e., estimate of rate of change of transit time). The coordinator may also estimate offset using the intercept of the linear fit. Determining/estimating offset may be performed in a similar manner to doing so for drift wherever disclosed. In an embodiment where probe records are collected at a given machine, that given machine may perform the applying 210 of the classifier to the probe records collected by that given machine, and the estimating 212 of the drift between the pairs of machines.

The drift estimate may not be completely accurate because, while the coded probes did not suffer from queuing delay, the coded probes may have suffered from the effect of network operation. The effect of network operation, as used herein, may refer to noise caused by components of a network. For example, a link or gateway between two paired machines may introduce latency or jitter that affects the drift estimation. In an embodiment, the coordinator uses 214 the network effect based on frequency drift estimations across three or more machines. Further details for using 214 the network effect will be described with respect to FIG. 5 below.

The coordinator sends 216 observations to a control loop of a local clock of a machine, e.g., by applying a filter to the estimated drift that is based on the effect of the network operation, or by feeding the estimated drift and the effect of the network operation to a machine learning model, the output of which is the absolute drift. Here, "absolute" drift or offset are relative to the reference clock. Further details about the control loop and how the coordinator estimates the absolute drift are described in further detail below with respect to FIGS. 6-8. After estimating the absolute drift, the coordinator may determine whether to correct 218 the clock frequency in real-time or near real-time. Absolute offsets may also be corrected 218, or the coordinator may perform 220 an offline correction. How to determine whether to correct in real-time, or offline, is described further below with reference to FIGS. 6-7.

In addition to correcting clock frequency and/or offset, process 200 recurs periodically for each machine pair to ensure that any new offset and drift that has occurred after correcting clock frequency and/or offset is continuously corrected. For example, process 200 may occur periodically (e.g., every two seconds) to ensure synchronization across the network (e.g., network 100) is maintained.

FIG. 3 is a block diagram of a system that illustrates probe transmission, according to an embodiment of the disclosure. System 304 depicts a network (e.g., network 100) with machines 310. Machines 310 have the same functionality described with respect to machines 110 of FIG. 1. System 304 depicts the transmitting 204 of probes between paired machines described with respect to FIG. 2. The number of machines that are paired to a given machine may be a number that is fixed by an administrator. In an embodiment, coordinator 130 may dynamically adjust the number of machines that are paired to each given machine for probing based on network conditions. For example, if network connectivity is above a threshold quality (e.g., based on a low amount of latency), coordinator 130 may reduce a number of machines that are paired for probing proportionally to the quality of network connectivity. On the other hand, as network connectivity quality deteriorates, coordinator 130 may increase the number of machines that are paired for probing to each given machine. The number of machines that are paired may also vary based on network size.

When selecting which machines should be paired to a given machine, coordinator 130 may randomly determine each machine to which the given machine should be paired. In an embodiment, coordinator 130 non-randomly determines pairings based on ease of computation, accuracy (e.g., clock synchronization accuracy as dictated by the network graph), and load balancing across each machine 110. Coordinator 130 may judiciously determine pairings based on design choice, with an administrator selecting pairings, or selecting parameters that cause certain pairings to be selected. Further, coordinator 130 may instruct a larger number of pairings to occur for machines that have a high level of diversity, relative to a number of pairings for machines that have a low level of diversity. As used herein, the term "diversity" may refer to a large number of paths from which a probe may cross within network 100 to reach a machine from another machine; the higher the number of paths, the higher the diversity.

While FIG. 3 does not depict a number of probes that pass between each pair of machines, it is noted that probes may occur at a particular frequency or period of time, which may vary based on one or more parameters. For example, coordinator 130 may command a machine that has a high diversity to transmit a large number of probes to one or more paired machines, each down a different path, as compared to a machine that has a low diversity, which may transmit a lower number of probes. Coordinator 130 thus may command machines to transmit machines to paired machines at a frequency that varies proportionate to diversity.

As depicted, the coordinator (e.g., coordinator 130) determines 202 that machine 310C of machines 310 is paired with machine 310B, machine 310F, machine 310H, and machine 310I, as shown by the dashed lines. Thus, machine 310C transmits 204 probes to machines 310B, 310F, 310H, and 310I, and receives probes from those same machines. The term "exchange" is used herein to describe scenarios where paired machines transmit and receive probes from one another. As used herein, the term exchange does not imply a timing aspect, such as a requirement that machines are transmitted simultaneously or responsive to one another.

In an embodiment, network 100 may be a trustless system, such as a system facilitating a blockchain network. In such an embodiment, some of machines 110 may misbehave and misrepresent data used to determine offset and/or drift. In such a scenario, in addition to the probes discussed above and with respect to FIG. 4, coordinator 130 may instruct machines 110 to probe, at low frequency (e.g., once per every ten, or one hundred, or one thousand probes sent in normal course), a larger number of machines (e.g., one-third of the machines of network 100). Coordinator 130 may determine therefrom whether the data obtained from the larger number of machines is consistent with the smaller number of machines that are probed in normal course (e.g., within a threshold tolerance amount of drift and/or offset), and may alert an administrator or take corrective action if inconsistent probe data is detected.

FIG. 4 is a data structure diagram that illustrates probe records, and manners of identifying coded probes from the probe records, according to an embodiment of the disclosure. Data structure 400 includes exemplary probe records for a plurality of probes. While data structure 400 is depicted to include probe records for a single transmitting machine "A" (which is, e.g., a machine 110 of network 100) and a single receiving machine "B," any number of transmitting or receiving machines may have probe records stored within data structure 400. Column 410 includes identifiers for probes, each identifier 1 through 6 corresponding to a probe record for a probe. Column 420 indicates which machine transmitted a probe indicated by a given probe record. Column 420, as depicted, indicates that a transmitting machine labeled "A" transmitted each probe; however, this is merely exemplary and various transmitting machines may be identified in column 420.

Column 430 indicates which machine received a probe indicated by a given probe record. Column 430, as depicted, indicates that a receiving machine labeled "B" received each probe; however, this is merely exemplary and various receiving machines may be identified in column 430. Column 440 indicates a transmit time of a probe. The transmit time is a time that is timestamped either by the transmitting machine itself (e.g., a CPU of transmitting machine "A" of network 100), or by an interface or device operably coupled to the transmitting machine (e.g., a NIC of transmitting machine "A" of network 100). Similarly, column 450 indicates a receive time of a probe, which is a timestamp by the receiving machine or, e.g., a NIC of the receiving machine. In an embodiment, a machine having a single CPU may have a plurality of NICs. In such an embodiment, coordinator 130 may cause the multiple NICs of a machine (e.g., the receiving machine) to sync to a clock of the CPU of the machine (e.g., by having the CPU synchronize its time to the time of the NIC, using the NIC as a reference machine as described herein), and then have the other NICs synchronize to the CPU, thus causing the multiple NICs of the machine to be synchronized.

The coordinator may command machines to transmit probes with a specified or predetermined time interval between probes. As used herein, the term "transmission time spacing" ($\delta$) refers to the specified interval or predetermined time interval between the transmission times of two probes. The interval may be a constant value or may be dynamically selected by the coordinator based on network conditions (e.g., if the network is congested, a longer transmission time spacing may be selected). As can be seen in FIG. 4, probe 1 is sent at time T1, which may be an arbitrary time or a time specified by the coordinator. Probe 2 is sent at time T1+$\delta$, as the coordinator has instructed transmitting machine A to transmit a probe to receiving machine B at one or more time intervals. Further probes may be commanded by the coordinator to be transmitted from transmitting machine A to receiving machine B from the reference point of time T1; however, for ease of illustration, only two are shown in FIG. 4. Similarly, probes 3 and 4 are sent at times T2 and T2+$\delta$, respectively, and probes 5 and 6 are sent at times T3 and T3+$\delta$, respectively.

Probe IDs 1 and 2, 3 and 4, and 5 and 6 are paired to illustrate how the coordinator determines whether a pair of probes are coded probes. Coded probes are probes that are transmitted with a specific spacing of $\delta$, or within a threshold distance from δ. That is, the probes are coded based on the space between each probe. Delay in timestamping probes may be caused by queues at a transmitting machine 420 and/or at a receiving machine 430 or through intermediate nodes. Coded probes are thus pairs of probes that are consecutively transmitted by a same transmitting machine 420, and received by a same receiving machine 430, with receive times that differ by δ, or within a threshold margin of δ (to accommodate minimal differences in delay between the two probes). That is, the transit times of two coded probes is approximately the same. While pairs are primarily used to describe coded probes, this is merely exemplary; coded probes may be triplets, quadruplets, etc., of probes with a spacing of δ.

Probes 1 and 2 show a scenario where two probes do not form coded probes because probe 1 has a transit time of TT, but probe 2 has a transit time of TT+D (D representing a delay), where D is greater than a threshold margin. That is, probe 2 has a transit time that is D longer than probe 2. Probes 3 and 4 show a scenario where two probes do not form coded probes because probe 3 has a transit time that is D longer than probe 4. Probes 5 and 6, however, are coded probes because they have the same transit times (to within an acceptable threshold).

In an embodiment, data structure 400 is stored in memory directly accessible to coordinator 130 (e.g., local memory of a machine running coordinator 130). In another embodiment, data structure 400 is distributed across machines 110, where each machine stores a local data structure 400 for probes exchanged between that machine and other machines. Various processing is described below with respect to FIGS. 5-8 that uses information of data structure 400; this processing may be performed by coordinator 130, but may also, or alternatively, be performed by machines 110. Where machines 110 are performing processing (e.g., identifying coded probes, applying a support vector machine, etc.), if one machine is overburdened with other processing, another machine in the pair may retrieve data of data structure 400 of the overburdened machine, and perform the processing on that overburdened machine's behalf.

Figure 5:
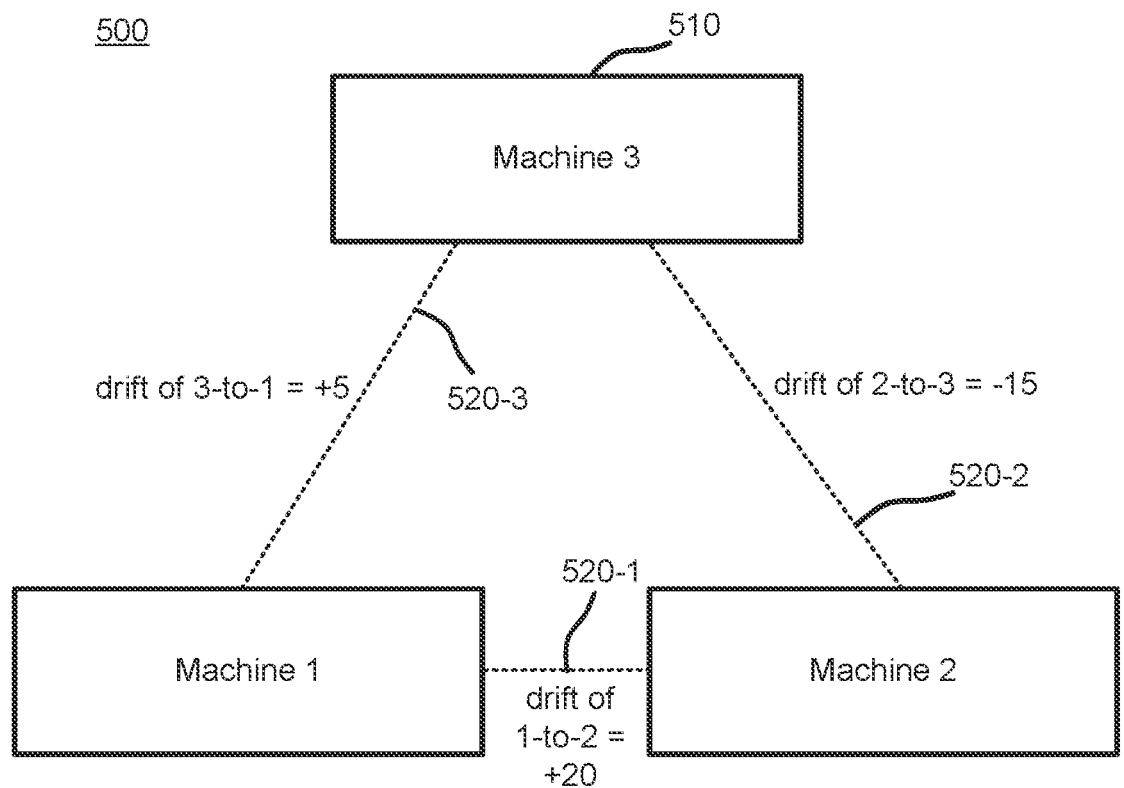
FIG. 5 is a graph of a system that illustrates identifying and correcting loop errors, according to an embodiment of the disclosure.

As was described above with respect to FIG. 2, coded probe records may be input into a classifier, such as an SVM classifier, from which drift may be estimated. However, a drift estimate may nonetheless be inaccurate, but correctable by using the network effect. FIG. 5 is a graph of a system that illustrates identifying and correcting loop errors, according to an embodiment of the disclosure. Machines 510 include machine 1, machine 2, and machine 3, which together form a network loop. Machines 510 have the same functionality described above with respect to machines 110 and 310. While only three machines are depicted, this is merely for convenience; any number of machines may form a network loop. Links 520 connect the machines of the network loop, where links 520-1 connect machine 1 to machine 2, links 520-2 connect machine 2 to machine 3, and links 520-3 connect machine 3 to machine 1. Each link may represent multiple different paths between each pair of machines.

The numbers over each link 520 are the drift between the two machines that are connected by each respective link in arbitrary units. Thus, link 520-1 reflects a drift of +20 units for the drift of machine 1 relative to the drift of machine 2, link 520-2 has a drift of −15 units between machines 2 and 3, and link 520-3 reflects a drift of +5 units between machines 3 and 1. The sum of the drifts around a given loop (referred to as the loop drift error, which is a result of network effect applied to frequency) is reflective of error in an estimated clock drift. Thus, if there was no loop drift error, then the sum of the drifts of all links in the loop would be 0 units. However, as depicted, the sum of the drifts is 10 units (in that 20−15+5=10), which may be caused by inaccurate clock estimates, which can be corrected using the network effect. The coordinator may assign a given machine to be part of multiple loops when assigning pairs. The coordinator may combine all loops for different pairs of machines to estimate clock drift more accurately using the network effect. When assigning pairs, the coordinator is not constrained by a need for path symmetry; the time taken (or number of hops) to go from machine 1 to machine 2 need not be the same as the time taken to go from machine 2 to machine 1. In an embodiment, some of the loops includes reference clock 140, thus ensuring the network effect is determined with respect to the reference clock. In an embodiment (e.g., where coordinator 130 is not present), the network effect can be used without reference to a reference clock, where each clock determines its frequency drift, and a statistical operation (e.g., average) is taken to determine the loop drift error. These loop drift errors around different loops are used to adjust the absolute drift of the machines in the loops. For example, the loop drift error for a loop may be allocated among the different machines in the loop.

Figure 6:
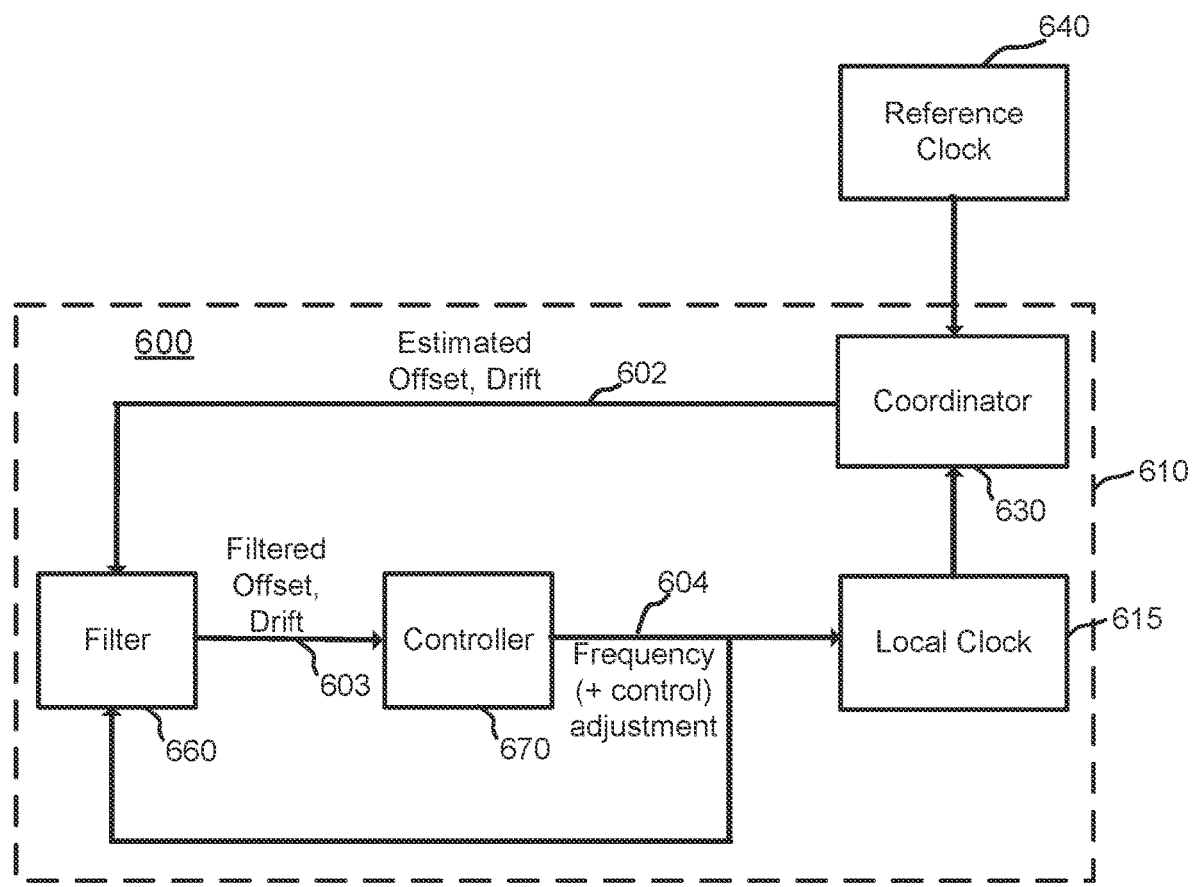
FIG. 6 is a block diagram of a model of a control system to correct a local clock frequency of a machine, according to an embodiment of the disclosure.

FIG. 6 is a block diagram of a model of an adaptive stochastic control system to correct a local clock frequency of a machine, according to an embodiment of the disclosure. Control loop 600 is used to adjust the frequency of a local clock 615 of a machine 610 by way of a control signal 604. The machine 610 may be a machine of network 100, and includes the same functionality described above with respect to machines 110, machines 310, and machines 510. Coordinator module 630 is depicted as part of machine 610, but may alternatively sit wholly or partially in a separate coordinator (e.g., coordinator 130), as described above with respect to FIG. 1.

Coordinator module 630 estimates the absolute offset and absolute drift 602 of machine 610, as described above with respect to FIGS. 2-5. These are absolute quantities because they are measured against the reference clock that is connected to a source of absolute time. The control loop 600 also includes a filter 660 and a controller 670. Filter 660 may be a predefined filter (e.g., a Kalman filter), a filter selected from an adaptive filter bank based on observations, a machine learning model, etc. Kalman filters and adaptive filter banks are discussed in further detail with respect to FIG. 7; use of a machine learning model is discussed in further detail with respect to FIG. 8.

The purpose of filter 660 is two-fold: first, to reduce noise in the drift and offset estimations and, second, to extrapolate the natural progression of the clock. Process 200 (from FIG. 2) repeats on a periodic basis (e.g., every two seconds), and thus control loop 600 loops periodically as well. In an embodiment, clock offsets are estimated in the middle of the period (e.g., 1 second into a 2-second period), whereas control signals happen at the end of the period (e.g., at the 2-second mark of the 2-second period). Thus, filter 660, in addition to reducing noise in the estimate, extrapolates to output 603 filtered offset and drift values that are accurate at the time of control. Filtered offset and drift are received by controller 670. Controller 670 outputs 604 a frequency (and offset) adjustment signal to local clock 615 of machine 610, the adjustment being reflective of frequency and offset value changes in local clock 615 to remove offset and drift from local clock 615. The frequency and offset adjustments are also fed back to filter 660 as parameters for the filter, in addition to the estimated offset and drift for the filter, on a subsequent cycle of the control loop. In this control loop, the plant under control is determined by the state variables {absolute offset, absolute drift} of the local machine and an adaptive stochastic controller is used to control the plant. As will be described with respect to FIG. 7 below, adaptive stochastic control refers to adjusting control signals based on a likelihood that a given adjustment is a correct adjustment, as compared to other possible adjustments; as control signals are applied, actual adjustments are observed, and probabilities that each possible control signal will lead to a correct adjustment are adjusted.

Figure 7:
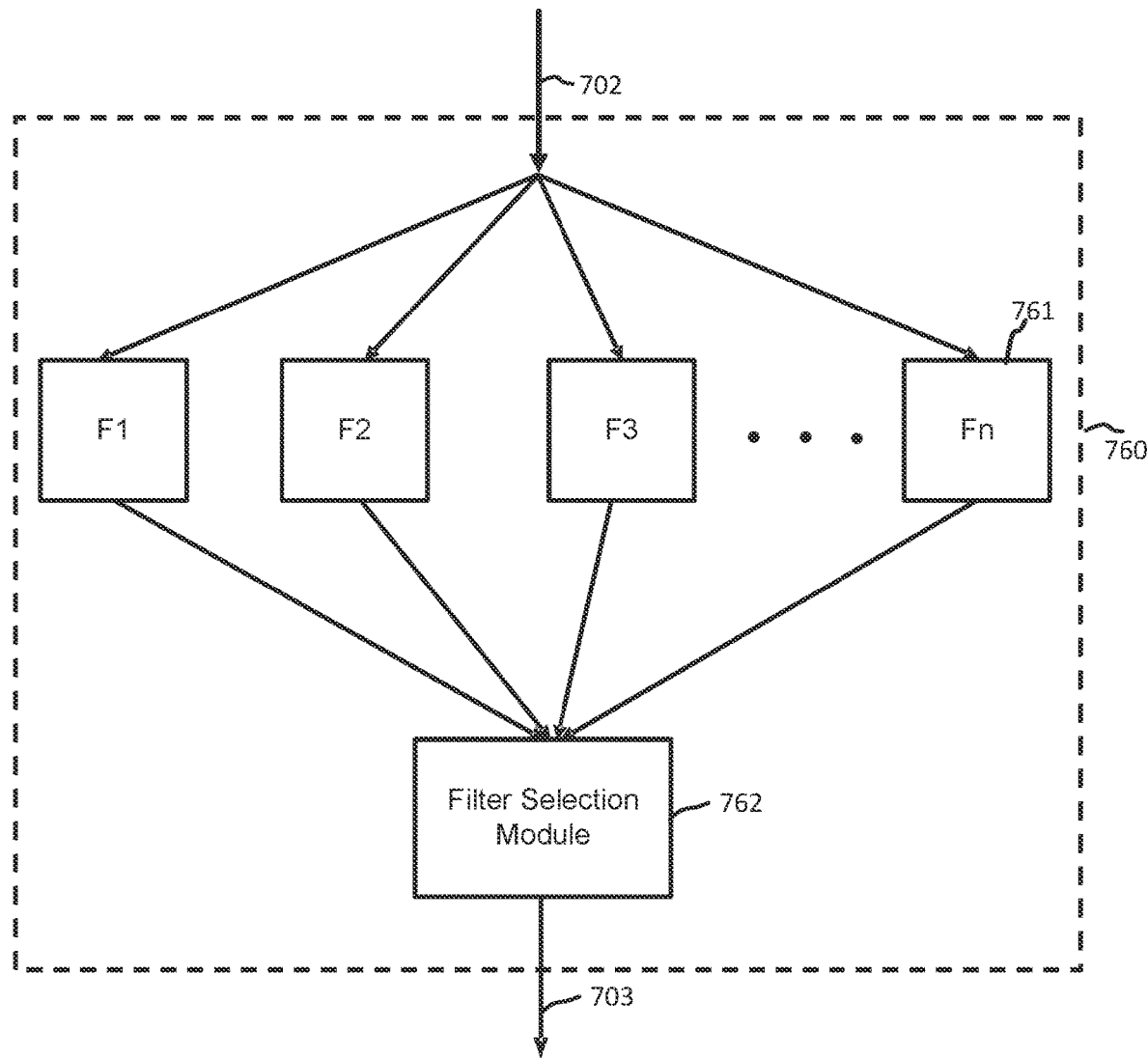
FIG. 7 is a block diagram of an adaptive filter bank, according to an embodiment of the disclosure.

FIG. 7 is a block diagram of an adaptive filter bank, according to an embodiment of the disclosure. The term adaptive filter bank, as used herein, may refer to a collection of candidate filters, each of which is best suited to remove noise from signals based on the type and degree of noise. For example, some noise can be observed, such as the network observations discussed with respect to FIGS. 1-6 (e.g., queuing delays, effect of network operation, loop errors, etc.). Some noise, however, is inherent in the state of the machines, and is unknown to control loop 600 (e.g., noise variations in response to control input across different makes and models of equipment). Noise that is unknown is referred to herein as state noise.

Filter 760, which includes the functionality of filter 660 as described above with respect to FIG. 6, includes a bank of candidate filters 761 (also referred to herein as an adaptive filter bank), which may be Kalman filters. Each of candidate filters 761 corresponds to a different level of state noise. Filter selection module 762 is a stochastic selection module, in that it selects a filter from candidate filter 761 by calculating a probability for each candidate filter being a best fit, and by then selecting the candidate filter with the best fit. Initially, filter selection module 762 receives observed noise, and uses the observed noise to select a highest probability candidate filter 761, which is used to filter the estimated drift and offset 702, and output the filtered drift and offset 703 to the controller 670. Using adaptive stochastic control, it is possible that initially filter selection module 762 may find that all filters are equally likely, and may select a filter arbitrarily. After selecting a filter and observing how local clock 615 reacts to a control signal, filter selection module 762 adjusts the likelihood that each candidate filter 761 best applies. Thus, as the control signal and further information about the network observations are fed into filter 760 over time, the selection of an appropriate candidate filter 761 eventually converges to a best matching candidate filter.

As was discussed with reference to FIG. 2, when deriving the control signal to be transmitted to the local clock of a machine, the correction may be performed in real-time, thus resulting in a real-time control signal (or near real-time control signal). In an embodiment, corrections may be performed offline, such as where observation noise is much smaller than state noise. For example, the coordinator may determine whether observation noise is a predefined amount or factor smaller than the state noise. In response to determining that the observation noise is a predefined amount or factor smaller than the state noise, the coordinator may perform the adjustment offline (or in batched fashion); otherwise, the coordinator may perform the adjustment in real-time or near-real-time and thus cause a control signal to quickly be sent to the local clock. An administrator of the system may set parameters that determine when offline corrections will be made, and may elect that offline corrections are not used at all.

Figure 8:
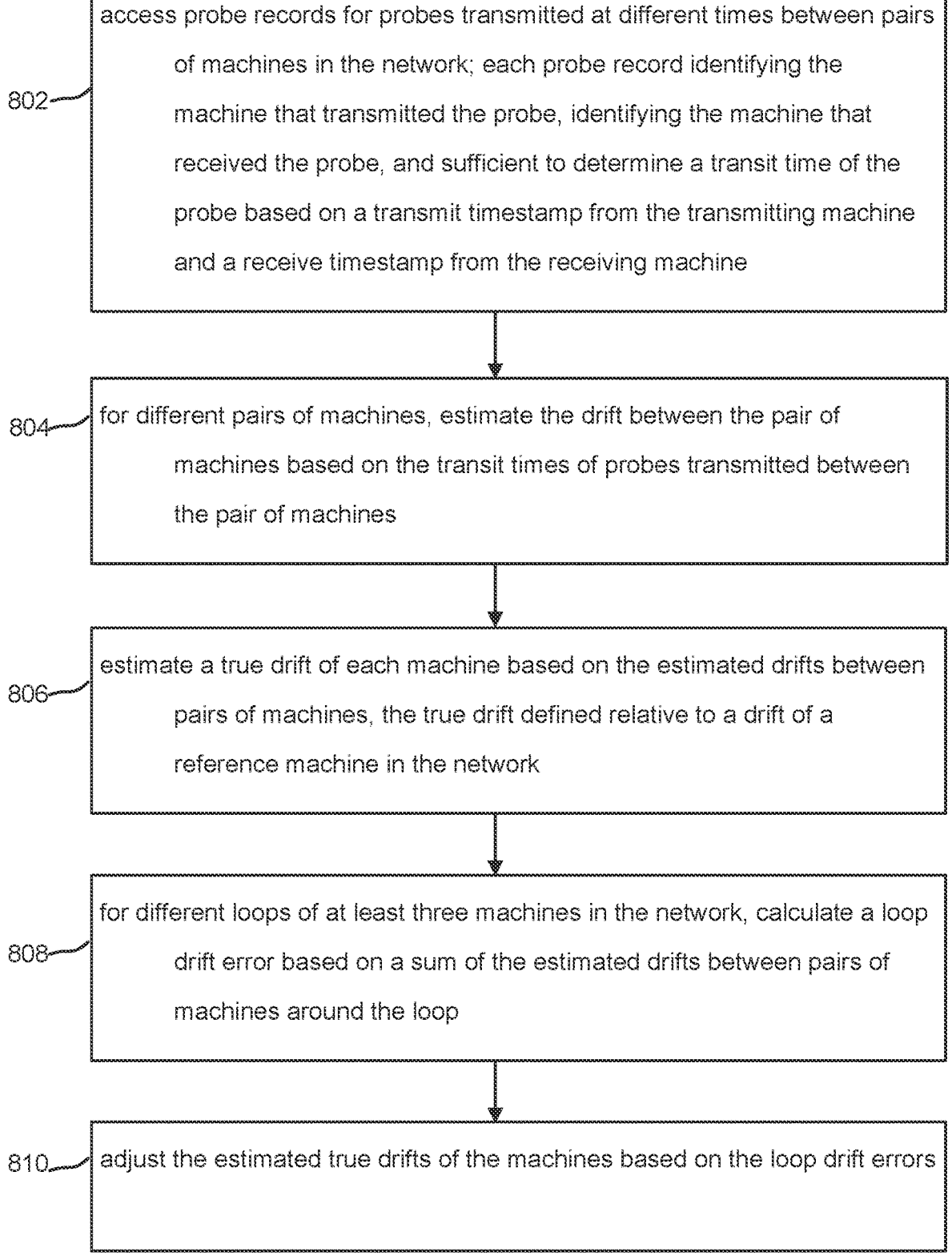
FIG. 8 is a flowchart that illustrates an exemplary process for implementing an embodiment of the disclosure.

FIG. 8 is a flowchart that illustrates an exemplary process for implementing an embodiment of the disclosure. Process 800 begins with a coordinator (e.g., coordinator 130) accessing 802 probe records (e.g., probe records of data structure 400) for probes transmitted at different times between pairs of machines in a network, such as a mesh network. The probe records (e.g., as indexed by probe ID 410) each identify the machine that transmitted the probe (e.g., transmitting machine 420), the machine that received the probe (e.g., receiving machine 430), and provide information sufficient for determining a transit time of the probe based on a transmit timestamp from the transmitting machine and a receive timestamp from the receiving machine. At least one of the machines exchanging probes produces timestamps based on the reference clock. The probe records may be stored within network 100, within a machine executing coordinator 130, or distributed across several machines.

For different pairs of machines, the coordinator (or the machines themselves) estimates 804 the drift between the pair of machines based on the transit times of probes transmitted between the pair of machines. For example, coordinator 130 derives coded probe records from the probe records and applies an SVM to the coded probe records to obtain a linear function, the slope of which is used to estimate the drift between the pair of machines.

In an embodiment, coordinator 130 optionally estimates 806 an absolute drift of each machine based on the estimated drifts between pairs of machines. In an embodiment, to determine absolute drift of a given machine, when the coordinator assigns pairs, each machine is paired with the reference machine. In an alternative embodiment, when the coordinator assigns pairs, each machine is paired with at least one machine that is paired with the reference machine. In a further alternative embodiment, each machine is at least indirectly paired with the reference machine, such that a chain of paired machines, as indicated by the network graph, eventually pairs a paired machine with the reference machine. As described above, reference clock 140 may be integrated into one or more of machines 110, such that one or more machines 110 have a clock that is used as a reference clock.

Coordinator 130 may additionally estimate an absolute offset of each machine. For example, transit times of coded probes feed into the aforementioned linear function, and thus, based on their transit times, the intercept of the linear function is determined. In an embodiment, the absolute offset may be determined to an accuracy on the order of nanoseconds.

As process 800 continues, for different loops of at least three machines, the coordinator calculates 808 a loop drift error based on a sum of the estimated drifts between pairs of machines around one or more loops (e.g., loop 500), as discussed above with reference to FIG. 5. The coordinator then adjusts 810 the estimated absolute drifts of the machines based on the loop drift errors (e.g., using control loop 600, as discussed above with reference to FIGS. 6-7), and transmits instructions to at least one of the machines (e.g., machine 610) to adjust a frequency of that machine's local clock (e.g., local clock 615) based on the estimated absolute drift for that machine.

As was described above with reference to FIG. 6-7, adjusting the frequency of a machine's local clock may include the coordinator applying adaptive stochastic control (e.g., by way of stochastic determination of a filter of filters 761). As used herein, the term stochastic control may refer to applying control signals based on a probability associated with candidate control signals (as dictated by candidate filters of an adaptive filter bank). As a result, state of the plant that is controlled may be modelled by the absolute offset and absolute drift of that machine, as state of the local clock feeds in to control loop 600. In another embodiment, the coordinator may apply a machine learning model as part of the controller to adjust the frequency of the machine's local clock, where the machine learning model receives the estimated absolute drift as an input, and outputs a control signal (e.g., control signal 604) to adjust the frequency of that machine's local clock (e.g., local clock 615).

The foregoing description of the embodiments of the disclosure may be implemented in a software module installed for use with off-the-shelf clocks, including inexpensive and inaccurate clocks, such as quartz clocks, for bringing such clocks into highly precise synchronization. The foregoing description of embodiments of the disclosure have been presented for the purpose of illustration; it is not intended to be exhaustive or to limit the invention to the precise forms disclosed, but merely illustrates different examples. It should be appreciated that the scope of the disclosure includes other embodiments not discussed in detail above. Persons skilled in the relevant art can appreciate that many modifications and variations are possible in light of the above disclosure, without departing from the spirit and scope as defined in the appended claims. Therefore, the scope of the disclosure should be determined by the appended claims and their legal equivalents.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments described herein is intended to be illustrative, but not limiting, of the scope of the disclosure, which is set forth in the following claims.

What is claimed is:

1. A non-transitory computer-readable medium comprising memory with instructions encoded thereon for syntonizing machines in a network, the instructions, when executed, causing one or more processors to perform operations, the instructions comprising instructions to:
   for different pairs of machines, estimate a drift between the pair of machines based on probe records storing transit times of probes transmitted between the pair of machines, at least one of the machines producing timestamps based on a reference clock;
   for different loops of at least three machines in the network, calculate a loop drift error based on a sum of the estimated drifts between pairs of machines around the loop; and
   adjust estimated absolute drifts of the machines based on the loop drift errors, wherein the absolute drift of a machine is defined relative to the reference clock.

2. The non-transitory computer-readable medium of claim 1 wherein the probe records comprise, for pairs of machines, probe records for probes transmitted in both directions between the machines in each of the pairs.

3. The non-transitory computer-readable medium of claim 1, wherein estimating the drift between the pair of machines is based on the transit times of coded probes, wherein coded probes are pairs of probes transmitted from one of the machines in the pair to the other of the machines in the pair, the transmit timestamps of the pair of probes are within a predetermined time interval of each other, and the transit times of the pair of probes are also within a predetermined deviation of each other.

4. The non-transitory computer-readable medium of claim 3, wherein the instructions to estimate the drift between the pair of machines comprise instructions to apply a support vector machine classifier to probe records for the coded probes for the pair of machines.

5. The non-transitory computer-readable medium of claim 1, wherein which machines transmit probes between each other changes based on network conditions.

6. The non-transitory computer-readable medium of claim 1, wherein each machine in the network transmits probes to a predefined maximum number of other machines.

7. A system comprising:
   a non-transitory computer-readable medium comprising memory with instructions encoded thereon for syntonizing machines in a network; and
   one or more processors that, when executing the instructions, cause the system to perform operations, the operations comprising:
      for different pairs of machines, estimating a drift between the pair of machines based on probe records storing transit times of probes transmitted between the pair of machines, at least one of the machines producing timestamps based on a reference clock;
      for different loops of at least three machines in the network, calculating a loop drift error based on a sum of the estimated drifts between pairs of machines around the loop; and
      adjusting estimated absolute drifts of the machines based on the loop drift errors, wherein the absolute drift of a machine is defined relative to the reference clock.

8. The system of claim 7, the operations further comprising:
   determining and instructing the machines as to which machines transmit probes to which other machines.

9. The system of claim 7, the operations further comprising estimating an absolute offset for each machine based on the transit times of probes transmitted between pairs of machines.

10. The system of claim 7, the operations further comprising:
    causing at least one of the machines to adjust a frequency of that machine's local clock based on the estimated absolute drift for that machine.

11. The system of claim 10, wherein adjusting the frequency of that machine's local clock comprises applying adaptive stochastic control to adjust the frequency of that machine's local clock.

12. The system of claim 10, wherein adjusting the frequency of that machine's local clock comprises applying adaptive stochastic control to the local clock, wherein a state of the local clock is determined by an absolute offset and the absolute drift of that machine.

13. The system of claim 10, wherein adjusting the frequency of that machine's local clock comprises applying adaptive stochastic control to adjust the frequency of that machine's local clock, and wherein the adaptive stochastic control includes a Kalman filter.

14. The system of claim 10, wherein adjusting the frequency of that machine's local clock comprises applying adaptive stochastic control to adjust the frequency of that machine's local clock, and wherein the adaptive stochastic control includes an adaptive filter bank.

15. The system of claim 10, wherein adjusting the frequency of that machine's local clock comprises applying a machine learning model to adjust the frequency of that machine's local clock, wherein the machine learning model receives the estimated absolute drift as an input and outputs a control signal to adjust the frequency of that machine's local clock.

16. The system of claim 10, wherein adjusting the frequency of that machine's local clock syntonizes that machine's local clock to the reference machine regardless of noise introduced in network observations.

17. The system of claim 16, wherein the noise introduced in network observations is attributable to instability in that machine's local clock from at least one of temperature variations and vibration variations.

18. A method for syntonizing machines in a network, the method comprising:

for different pairs of machines, estimating a drift between the pair of machines based on probe records storing transit times of probes transmitted between the pair of machines, at least one of the machines producing timestamps based on a reference clock;

for different loops of at least three machines in the network, calculating a loop drift error based on a sum of the estimated drifts between pairs of machines around the loop; and adjusting estimated absolute drifts of the machines based on the loop drift errors, wherein the absolute drift of a machine is defined relative to the reference clock.

19. The method of claim 18, wherein at least one of the transmit timestamps and the receive timestamps includes at least one of a network interface card (NIC) timestamp, a computer processor unit (CPU) timestamp, a virtual machine (VM) timestamp, a container timestamp, and an antenna timestamp.

20. The method of claim 18, wherein a human administrator defines at least one of the reference clock, and a reference group of machines.

* * * * *